United States Patent
Watanabe et al.

(10) Patent No.: US 10,392,253 B2
(45) Date of Patent: Aug. 27, 2019

(54) AGGREGATE OF CARBON NANOTUBES, CARBON NANOTUBE COMPOSITE MATERIAL, AND CARBON NANOTUBE WIRE

(71) Applicant: FURUKAWA ELECTRIC CO., LTD., Tokyo (JP)

(72) Inventors: Masashige Watanabe, Tokyo (JP); Hideki Aizawa, Tokyo (JP); Kazutomi Miyoshi, Tokyo (JP); Satoshi Yamashita, Tokyo (JP); Yoshinori Kazama, Tokyo (JP); Yuudai Tanimura, Tokyo (JP); Koji Fujimura, Tokyo (JP); Morinobu Endo, Nagano (JP); Kenji Takeuchi, Nagano (JP); Masatsugu Fujishige, Nagano (JP)

(73) Assignee: Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 15/895,941

(22) Filed: Feb. 13, 2018

(65) Prior Publication Data
US 2018/0170757 A1 Jun. 21, 2018

Related U.S. Application Data

(63) Continuation-in-part of application No. PCT/JP2016/057538, filed on Mar. 10, 2016.

(30) Foreign Application Priority Data

Aug. 24, 2015 (JP) .................................. 2015-165179

(51) Int. Cl.
*H01B 1/04* (2006.01)
*B82Y 30/00* (2011.01)
(Continued)

(52) U.S. Cl.
CPC .............. *C01B 32/16* (2017.08); *B82Y 30/00* (2013.01); *B82Y 40/00* (2013.01); *C01B 32/158* (2017.08);
(Continued)

(58) Field of Classification Search
CPC ........... H01B 1/04; C01B 32/16; C01B 31/04; C01B 31/0407; C01B 31/0415;
(Continued)

(56) References Cited

U.S. PATENT DOCUMENTS 6,090,363 A * 7/2000 Green .................... B82Y 30/00
423/445 B
2004/0241079 A1 12/2004 Takenobu et al.
(Continued)

FOREIGN PATENT DOCUMENTS

CN 1701040 A 11/2005
CN 101039873 A 9/2007
(Continued)

OTHER PUBLICATIONS

English translation of Written Opinion (PCT/ISA/237) issued in PCT/JP2016/057538 dated Apr. 2016.
(Continued)

*Primary Examiner* — Daniel C. McCracken
(74) *Attorney, Agent, or Firm* — Chen Yoshimura LLP

(57) ABSTRACT

A low-resistivity carbon nanotube aggregate includes a plurality of carbon nanotubes each having one or more walls, wherein a ratio of a total number of carbon nanotubes that have two or three walls relative to a total number of said plurality of carbon nanotubes is 75% or greater, and wherein, in a G band of a Raman spectrum in the Raman spectroscopy of the plurality of carbon nanotubes, a G+/Gto-
(Continued)

tal ratio that is indicative of an amount of semiconductor carbon nanotubes relative to metallic carbon nanotubes is 0.70 or greater.

18 Claims, 13 Drawing Sheets

(51) Int. Cl.
| | | |
|---|---|---|
| *B82Y 40/00* | (2011.01) | |
| *C01B 32/16* | (2017.01) | |
| *H01L 51/00* | (2006.01) | |
| *C01B 32/158* | (2017.01) | |
| *C01B 32/168* | (2017.01) | |

(52) U.S. Cl.
CPC .............. *C01B 32/168* (2017.08); *H01B 1/04* (2013.01); *H01L 51/002* (2013.01); *H01L 51/0048* (2013.01); *C01B 2202/06* (2013.01); *C01B 2202/22* (2013.01); *C01B 2202/34* (2013.01); *C01B 2202/36* (2013.01)

(58) Field of Classification Search
CPC .............. C01B 31/0423; C01B 31/043; C01B 31/0438; C01B 31/0446; C01B 31/0453; C01B 31/0461; C01B 31/0469; C01B 31/0476; C01B 31/0484; C01B 31/0492; C01B 2204/00; C01B 2204/02; C01B 2204/04; C01B 2204/06; C01B 2204/065; C01B 2204/20; C01B 2204/22; C01B 2204/24; C01B 2204/28; C01B 2204/30; C01B 2204/32; H01L 51/0048; H01L 51/002; B82Y 40/00; B82Y 30/00
USPC ........ 423/447.1–447.3, 445 B; 977/742–754, 977/842–848
See application file for complete search history.

(56) References Cited

U.S. PATENT DOCUMENTS

| | | | |
|---|---|---|---|
| 2007/0092431 A1 | 4/2007 | Resasco et al. | |
| 2008/0031804 A1* | 2/2008 | Taki | B82Y 10/00 423/447.7 |
| 2008/0170982 A1* | 7/2008 | Zhang | B82Y 10/00 423/447.3 |
| 2010/0119436 A1* | 5/2010 | Takimoto | B01J 21/185 423/447.2 |
| 2012/0058889 A1* | 3/2012 | Nishino | B01J 21/10 502/328 |
| 2013/0251619 A1 | 9/2013 | Rikihisa et al. | |
| 2014/0084219 A1 | 3/2014 | Zhao et al. | |

FOREIGN PATENT DOCUMENTS

| | | |
|---|---|---|
| JP | 2003-160320 A | 6/2003 |
| JP | 2008-201626 A | 9/2008 |
| JP | 2008/544939 A | 12/2008 |
| JP | 2012-127043 A | 7/2012 |
| JP | 2014-517797 A | 7/2014 |
| WO | 2005/091345 A1 | 9/2005 |
| WO | 2013/018901 A1 | 2/2013 |

OTHER PUBLICATIONS

International Search Report (ISR) issued in PCT/JP2016/057538 dated Apr. 2016.
Written Opinion (PCT/ISA/237) issued in PCT/JP2016/057538 dated Apr. 2016. (Concise Explanation of Relevance: This Written Opinion considers that the some of claims are not described by or obvious over the references Foreign Patent Document Nos. 2-7 cited in ISR above.).
Puech et al., "Charge transfer between carbon nanotubes and sulfuric acid as determined by Raman spectroscopy", (May 2012) Physical review B. Condensed matter and materials physics, vol. 85, Iss. 20, pp. 1-6. ISSN 1098-0121.
Chinese Office Action dated Mar. 14, 2019 in a counterpart Chinese patent application No. 201680044706.5.
European Search Report dated Mar. 1, 2019 in a counterpart European patent application No. 16 838 830.4.
Cambedouzou et al., "Raman spectroscopy of iodine-doped double-walled carbon nanotubes", Arxiv. Org, Cornell University Library, 201 Olin Library Cornell Uniiversity Ithaca, NY 14853, Oct. 26, 2004.
European Search Report dated Jun. 6, 2019 in a counterpart European patent application No. 16 838 830.4.

\* cited by examiner

AGGREGATE OF CARBON NANOTUBES, CARBON NANOTUBE COMPOSITE MATERIAL, AND CARBON NANOTUBE WIRE

BACKGROUND OF THE INVENTION

Technical Field

The present invention relates to a carbon nanotube aggregate constituted of bundles having a plurality of carbon nanotubes, a carbon nanotube composite material, and a carbon nanotube wire, and in particular relates to a carbon nanotube aggregate constituted of carbon nanotubes for performing doping, a carbon nanotube composite material having a doping element that is different from carbon in the carbon nanotubes, and a carbon nanotube wire formed by bundling carbon nanotube aggregate or carbon nanotube composite material.

Background Art

Conventionally, electric lines constituted of a core wire made of one or more wires and an insulating cover that covers that core wire have been used as power lines or signal lines in various areas such as automobiles and industrial equipment. As materials forming the wire that constitutes the core wire, copper or a copper alloy is typically used from the perspective of electrical characteristics, but in recent years, aluminum or aluminum alloys have been proposed from the perspective of reducing weight. For example, the specific gravity of aluminum is approximately ⅓ that of copper and the conductivity of aluminum is approximately ⅔ that of copper (based on a standard in which pure copper is 100% IACS, pure aluminum is approximately 66% IACS). Thus, in order to pass the same current in an aluminum wire as a copper wire, it is necessary to increase the cross-sectional area of the aluminum wire to approximately 1.5 times that of a copper wire, and even if an aluminum wire with this increased cross-sectional area were to be used, the mass of the aluminum wire would be approximately half that of a pure copper wire, and therefore, the use of an aluminum wire is advantageous from the perspective of reducing weight.

Against this backdrop, recently, there has been a trend of increasing performance and functionality of automobiles, industrial equipment, and the like, and as a result, there has been an increase in the number of various electrical instruments, control instruments, and the like that are being installed, and thus, there is an increase in the number of electrical wires used in such instruments. Meanwhile, in order to improve the fuel economy of a moving body such as an automobile in order to help the environment, there is strong demand for reduced weight for wires.

As a new means for achieving further reductions in weight, there have been new proposals for techniques that use carbon nanotubes for wires. Carbon nanotubes form a three-dimensional network structure constituted of a single cylindrical wall having a hexagonal grid network structure, or constituted of multiple walls disposed substantially coaxially. Carbon nanotubes are lightweight as well as having excellent characteristics such as conductivity, current capacity, elasticity, and mechanical strength, and thus, are garnering attention as a substitute for metals used in power lines or signal lines.

The specific gravity of carbon nanotubes is approximately ⅕ that of copper (approximately ½ that of aluminum), and carbon nanotubes individually have a higher conductivity than copper (resistivity of $1.68 \times 10^{-6}$ Ω·cm). Thus, theoretically, if a carbon nanotube aggregate were formed by intertwining a plurality of carbon nanotubes, it would be possible to achieve further reductions in weight and higher conductivity. However, if nm-level carbon nanotubes were intertwined to form a μm-to-mm-level carbon nanotube aggregate, then contact resistance between carbon nanotubes as well as internal defects would cause an increase in resistance for the wire as a whole, which has meant that using carbon nanotubes as is to form a wire has been difficult.

One method to improve conductivity in a carbon nanotube aggregate is to control the network structure (chirality) of carbon nanotubes, which are the component units, and to dope the carbon nanotubes.

There is a method in which carbon nanotubes having two or more walls are doped using at least one type of dopant, for example. In this method, when forming carbon nanotubes or after forming carbon nanotube wires, the carbon nanotubes are doped by sputtering, spraying, soaking, or the introduction of a gas phase, thereby forming a carbon nanotube wire having a dopant including iodine, silver, chlorine, bromine, fluorine, gold, copper, aluminum, sodium, iron, antimony, arsenic, or a combination thereof. It is indicated that as a result, electrical properties such as high specific conductivity, low resistivity, high current-carrying capacity, and thermal stability can be attained (Patent Document 1, for example).

Related Art Document

Patent Document
Patent Document 1: Japanese Translation of PCT International Application Publication No. 2014-517797

SUMMARY OF THE INVENTION

However, the above patent document only indicates that a carbon nanotube aggregate in which double-walled carbon nanotubes are doped with iodine has a resistivity of $1.55 \times 10^{-5}$ Ω·cm. In other words, compared to a resistivity of $1.68 \times 10^{-6}$ Ω·cm for copper or a resistivity of $2.6 \times 10^{-6}$ Ω·cm for aluminum, the resistivity of a carbon nanotube aggregate is higher by more than an order of magnitude, and thus, would not be a satisfactory substitute for copper or aluminum for use as a wire. Also, amid rapid and dramatic advances in performance and functionality that are anticipated for various industrial fields, further reduction in resistivity is demanded. Accordingly, the present invention is directed to a scheme that substantially obviates one or more of the problems due to limitations and disadvantages of the related art.

An object of the present invention is to provide a carbon nanotube aggregate, a carbon nanotube composite material, and a carbon nanotube wire by which it is possible to realize further reduction in resistance compared to conventional carbon nanotube aggregates, as well as realizing comparable resistivity to copper and aluminum, and realizing major improvement in electrical properties.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one or more aspects, the present disclosure provides the following.

(1) A carbon nanotube aggregate, including: a plurality of carbon nanotubes each having one or more walls, wherein a ratio of a total number of carbon nanotubes that have two- or three-walls relative to a total number of the plurality of carbon nanotubes is 75% or greater, and wherein, in a G band of a Raman spectrum in Raman spectroscopy of the plurality of carbon nanotubes, a G+/Gtotal ratio that is indicative of an amount of semiconductor carbon nanotubes relative to metallic carbon nanotubes is 0.70 or greater.

(2) The carbon nanotube aggregate according to (1), wherein a G/D ratio that is defined as a ratio in the Raman spectrum of the G band and a D band due to a crystallinity is 45 or greater.

(3) The carbon nanotube aggregate according to (1), wherein at least some of the plurality of carbon nanotubes are doped with one or more of nitric acid, sulfuric acid, iodine, bromine, potassium, sodium, boron, and nitrogen.

(4) The carbon nanotube composite material according to (1), wherein at least some of the plurality of carbon nanotubes are doped with one of lithium, rubidium, cesium, calcium, strontium, barium, fluorine, chlorine, bromine, and iodine.

(5) The carbon nanotube aggregate according to any one of (1) to (4), wherein an outer diameter of an outermost wall of the carbon nanotubes is 5.0 nm or less.

(6) A carbon nanotube wire comprising a bundle of the plurality of carbon nanotubes as set forth in any one of (1) to (5).

(7) A carbon nanotube composite material, including: a carbon nanotube having one or more walls; and a doping element that is different from carbon and included inside the carbon nanotube, wherein a minimum distance between carbon atoms forming an innermost wall of the carbon nanotube and an atom of the doping element is less than a distance between the carbon atoms forming the innermost wall of the carbon nanotube and a center of the carbon nanotube.

(8) The carbon nanotube composite material according to (7), wherein the minimum distance is not less than 2.0 angstroms and not more than 4.0 angstroms.

(9) The carbon nanotube composite material according to (7), wherein the doping element is one of lithium, sodium, potassium, rubidium, cesium, calcium, strontium, barium, fluorine, chlorine, bromine, and iodine.

(10) The carbon nanotube composite material according to (7), wherein the carbon nanotube has a two or three walls.

(11) The carbon nanotube composite material according to (9) or (10), wherein a charge transfer amount between the carbon atoms forming the innermost wall of the carbon nanotube and the atom of the doping element positioned at the minimum distance is 0.5 or greater per the doping element.

(12) The carbon nanotube composite material according to any one of (9) to (11), wherein a ratio of a mass of the carbon nanotube composite material in relation to a mass of the carbon nanotubes is 1.005 to 1.25.

(13) A carbon nanotube wire, including a bundle of a plurality of the carbon nanotubes, each of at least some of said plurality of the carbon nanotubes being the carbon nanotube composite material as set forth in any one of (7) to (12).

(14) A carbon nanotube aggregate, including: a plurality of carbon nanotubes having one or more walls; and a doping element included inside at least some of the plurality of the carbon nanotubes, wherein a ratio of a total number of carbon nanotubes having two or three walls relative to a total number of the plurality of carbon nanotubes is 75% or greater, wherein, in a G band of a Raman spectrum in Raman spectroscopy of the plurality of carbon nanotubes, a G+/Gtotal ratio that is indicative of an amount of semiconductor carbon nanotubes relative to metallic carbon nanotubes is 0.70 or greater, and wherein in said at least some of the plurality of the carbon nanotubes having the doping element included therein, a minimum distance between carbon atoms forming an innermost wall of the carbon nanotube and an atom of the doping element is less than a distance between the carbon atoms forming the innermost wall of the carbon nanotube and a center of the carbon nanotube.

(15) A carbon nanotube wire, including a bundle of the carbon nanotube aggregate as set forth in (14).

According to the present invention, the proportion of the number of carbon nanotubes having a two- or three-walled structure in relation the total number of carbon nanotubes constituting the carbon nanotube aggregate is 75% or greater, and among peaks due to a G band of a Raman spectrum in Raman spectroscopy, a G+/Gtotal ratio due to semiconductor carbon nanotubes is 0.70 or greater. In other words, by forming a configuration such that the proportion of CNTs having a number of walls (two or three) that can bring about maximum doping effects is in the above-mentioned range, and setting the proportion of the number of semiconductor CNTs in relation to all the CNTs constituting the CNT aggregate to within the above-mentioned range, it is possible to achieve even lower resistance compared to conventional carbon nanotube wires, and it is also possible to achieve a substantially equivalent resistivity to the $1.68 \times 10^{-6}$ Ω·cm of copper and the $2.65 \times 10^{-6}$ Ω·cm of aluminum. Thus, it is possible to provide a carbon nanotube aggregate with greatly improved electrical characteristics.

Also, according to the present invention, a carbon nanotube composite material includes a carbon nanotube having a structure with one or more walls, and a doping element that is different from carbon included inside the carbon nanotube, a minimum distance between carbon atoms forming the carbon nanotube and an atom of the doping element being less than a distance between the carbon atoms forming the carbon nanotube and a center position of the carbon nanotube in a radial direction cross-section. As a result, carriers are generated in the carbon nanotube and the amount of carriers contributing to conductivity can be increased, and thus, it is possible to realize greater conductivity than in carbon nanotube composite materials doped in a conventional manner, and it is possible to provide the carbon nanotube composite material with greatly improved electrical characteristics.

It is to be understood that both the foregoing general description and the following detailed description are exemplary and explanatory, and are intended to provide further explanation of the invention as claimed.

BRIEF DESCRIPTION OF THE DRAWINGS

FIGS. 1A and 1B are a perspective view and an electron microscope image of the carbon nanotube wire, FIGS. 1C and 1D are a perspective view and an electron microscope image of a bundle of carbon nanotubes, and FIGS. 1E and 1F are a perspective view and an electron microscope image of a carbon nanotube that constitutes the bundle of carbon nanotubes.

FIG. 8A is a partial plan view showing an example of a CNT composite material formed by doping a CNT having a single-walled structure with lithium, which is a doping element, and FIG. 8B is a side view thereof.

FIG. 10A shows the adsorption energy, and FIG. 10B shows the charge transfer amount between carbon atoms constituting the carbon nanotube and atoms of the doping elements located at the closest possible distance therefrom.

FIG. 12A is a side view image of the carbon nanotube aggregate, and FIG. 12B is a cross-sectional view of the carbon nanotube aggregate.

FIG. 13A is a cross-sectional view of the composite material doped with iodine, and FIG. 13B is a cross-sectional view of the composite material doped with potassium.

DETAILED DESCRIPTION OF EMBODIMENTS

An embodiment of the present invention will be described in detail below with reference to the drawings.

FIGS. 1A to 1F schematically show the structure of a carbon nanotube wire according to an embodiment of the present invention. The carbon nanotube wire shown in FIGS. 1A to 1F is one example, and the shape, dimensions, and the like of each structure in the present invention are not limited to those of FIGS. 1A to 1F.

Figure 1A:
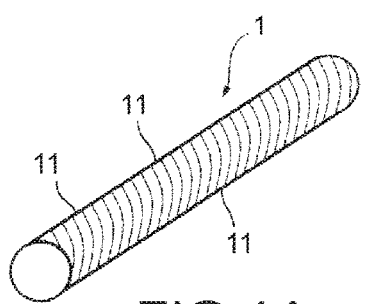
FIGS. 1A to 1F schematically show the structure of a carbon nanotube wire according to an embodiment of the present invention.
Figure 1B:
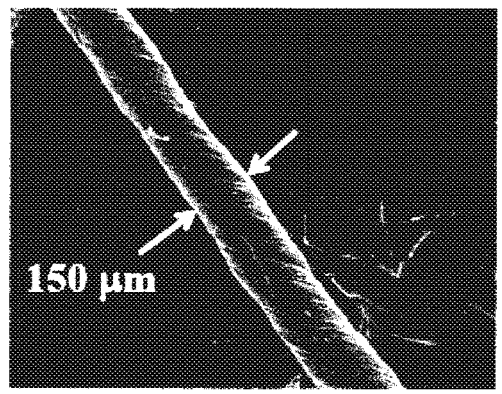

As shown in FIGS. 1A and 1B, a carbon nanotube wire 1 (hereinafter referred to as "CNT wire") according to the present embodiment is constituted of bundles 11 (hereinafter referred to as CNT bundles or CNT aggregate) including a plurality of carbon nanotubes having one or more walls, and a plurality of the CNT bundles 11 are intertwined. The outer diameter of the CNT wire 1 is 0.01 to 1 mm.

Figure 1C:
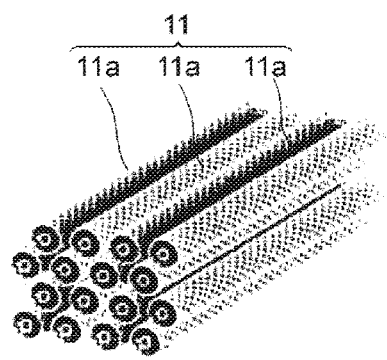
Figure 1D:
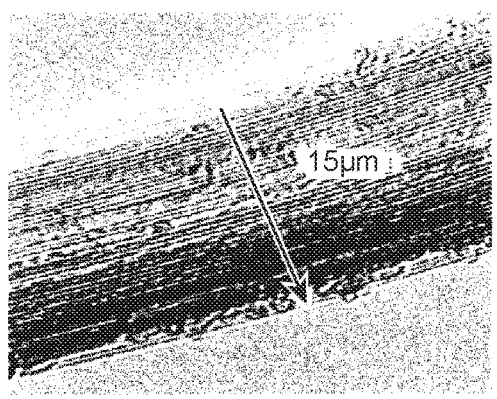
Figure 1E:
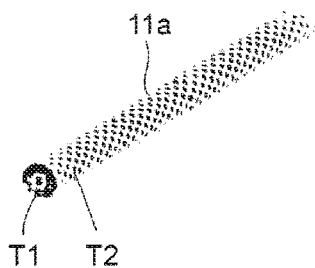
Figure 1F:
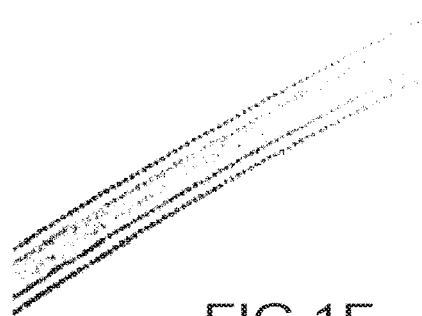

As shown in the enlarged view of FIGS. 1C and 1C, the CNT bundle 11 is formed as a bundle in which a plurality of carbon nanotubes 11a (hereinafter referred to as CNTs) are aggregated together, and the axial directions of the plurality of CNTs are all substantially the same.

Also, the CNTs 11a constituting the CNT bundle 11 are tubes having a single-walled structure or a multi-walled structure, which are respectively referred to as single-walled nanotubes (SWNT) and multi-walled nanotubes (MWNT). For ease of viewing, in FIGS. 1C to 1F, only CNTs having a two-walled structure are shown, but in reality, there are also CNTs with three-walled structures. CNTs having a single-walled structure or a structure with four or more walls may be included among the CNT bundles 11, but there are fewer of these than CNTs having a two- or three-walled structure.

Figure 2:
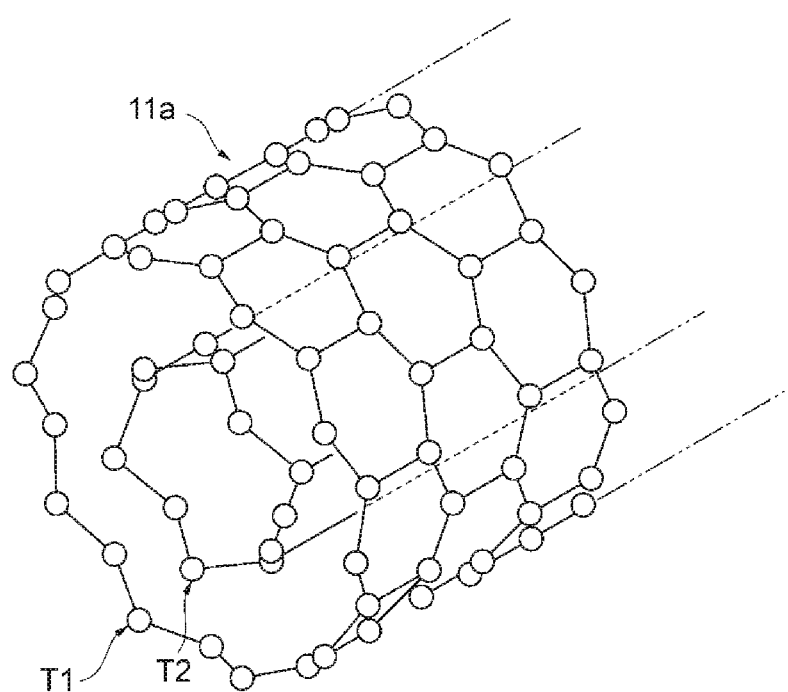
FIG. 2 is an enlarged perspective view of the carbon nanotube of FIG. 1E.

As shown in FIG. 2, the CNT 11a has a three-dimensional network structure in which two tubular bodies T1 and T2 having a hexagonal grid network structure are arranged coaxially, and is referred to as a double-walled nanotube (DWNT). The hexagonal grid, which is the component unit, is a six-membered ring having a carbon atom at each vertex, and each of six-membered rings is adjacent to other six-membered rings, all of which are successively coupled. Also, the plurality of CNTs 11a are doped with a doping element(s) or molecule(s) that is different from carbon by a doping process to be described later.

The properties of the CNT 11a depend on the chirality of the tube such as that described above. Chirality is mainly classified as being of an armchair type, a zigzag type, or other chiral types. The armchair chirality type behaves like a metal, the chiral type behaves like a semiconductor, and the zigzag type has a behavior intermediate therebetween. Thus, the conductivity of the CNT depends greatly on the chirality, and in order to improve the conductivity of the CNT aggregate, it was seen as crucial to increase the proportion of armchair-type CNTs, which behave like metals. On the other hand, it was found that by doping a chiral-type CNT, which behaves like a semiconductor, with a substance (doping element) having electron-donating or electron-accepting properties, the CNT could be imparted with metallic properties. Also, for typical metals, doping them with a doping element results in diffusion of conduction electrons in the metal, thus reducing conductivity, and similarly, doping CNTs with metallic properties with a doping element reduces its conductivity.

Thus, the effect of doping metallic CNTs and the effect of doping semiconductor CNTs are in a trade-off relationship in terms of conductivity, and thus, theoretically, it is preferable that metallic CNTs and semiconductor CNTs be produced separately with only semiconductor CNTs being doped, and the metallic CNTs and semiconductor CNTs being combined thereafter. However, it is difficult to selectively produce metallic CNTs and semiconductor CNTs with current manufacturing techniques, and metallic CNTs and semiconductor CNTs are produced in a mixed state. Thus, in order to improve conductivity of a CNT wire made of a mixture of metallic CNTs and semiconductor CNTs, it is necessary to select a CNT structure for which doping with a doping element(s) or molecule(s) would be effective.

In the present embodiment, in order to attain a low resistivity CNT aggregate, the aggregate is configured to have a prescribed proportion of CNTs that have a number of walls that can bring about the maximum doping effects, while optimizing the percentage of the number of semiconductor CNTs with respect to the total number of CNTs constituting the CNT aggregate.

<Proportion of the Sum of the Number of Two- or Three-Walled CNTs to the Number of the Plurality of CNTs Constituting CNT Aggregate be 75% or Greater>

Figure 3A:
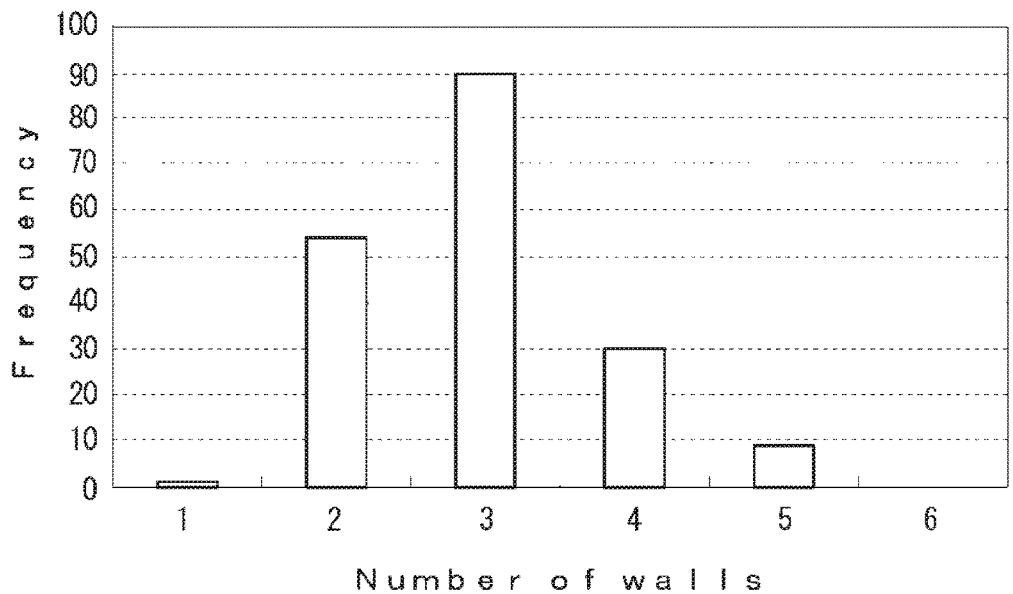
FIGS. 3A and 3B are graphs showing a distribution of the number of walls and a distribution of the outer diameters of a plurality of carbon nanotubes constituting a carbon nanotube aggregate according to the present embodiment.

In the present embodiment, in the CNT aggregate 11 formed by bundling the plurality of CNTs 11a the proportion of the sum of the number of two- or three-walled CNTs to the number of the plurality of CNTs 11a. is 75% or greater of. An example of the results of measuring the number of walls of the CNTs constituting the CNT aggregate 11 is shown in the graphs of FIG. 3A. In FIG. 3A, the proportion of the sum of the number of two-walled CNTs (55) and the number of three-walled CNTs (90) to the total number of CNTs (186) constituting the CNT aggregate 11 is 78.0% (=145/186×100). In other words, where the total number of all the CNTs constituting one CNT aggregate is $N_{TOTAL}$, the total number of CNTs (2) having a two-walled structure among all of the CNTs is $N_{CNT(2)}$, and the total number of CNTs (3) having a three-walled structure among all of the CNTs is $N_{CNT(3)}$, the relationship can be expressed by the following formula (1).

$$(N_{CNT(2)}+N_{CNT(3)})/N_{TOTAL} \times 100(\%) \geq 75\% \quad (1)$$

CNTs with a small number of walls such as those with a two- or three-walled structure have a higher conductivity than CNTs with a larger number of walls. Also, the dopant is introduced inside the innermost wall of the CNTs or in gaps between CNTs formed by a plurality of CNTs. The distance between the walls of the CNT is comparable to the 0.335 nm, which is a distance between layers of graphite, and in terms of size, it is difficult for a dopant to enter between the walls of a CNT having a large number of walls. Thus, although the doping effects would be seen by introducing dopants both to the inside and outside of the CNTs, in the case of CNTs having a large number of walls, the doping effect is difficult to be exhibited in tubes located on the inside, which is not in contact with the outermost wall or the innermost wall. By the reasons above, when doping multi-walled CNTs, the doping effect is most pronounced in two- or three-walled CNTs. Also, the dopant is often a reagent having a high reactivity, with strong electrophilicity or nucleophilicity. Single-walled CNTs are less rigid than multi-walled CNTs and have low chemical resistance, and thus, when subjected to doping, the structure of the CNT itself is sometimes damaged. Thus, the present invention is focused on the number of CNTs having a two- or three-walled structure included in the CNT aggregate. If the proportion of the number of CNTs having a two- or three-walled structure is less than 75%, then the proportion of CNTs having a single-walled structure or a structure having four or more walls becomes high, resulting in a low doping effect for the CNT aggregate as a whole, which means that high conductivity cannot be attained. Thus, the proportion of the total number of two- or three-walled CNTs is set to the above-mentioned range.

Figure 3B:
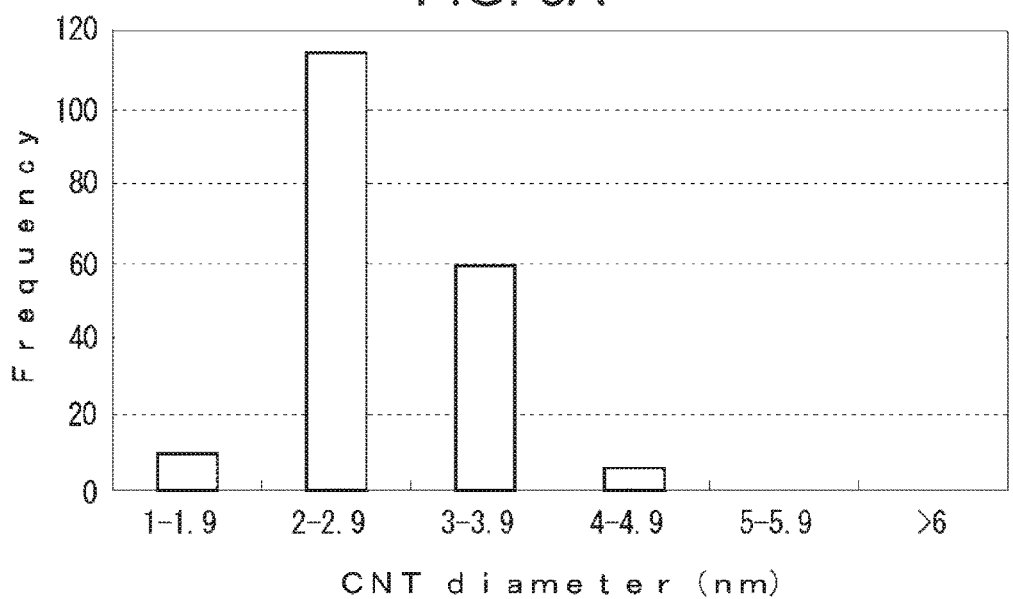

In the present embodiment, it is preferable that the outer diameter of the outermost walls of the CNTs constituting the CNT aggregate 11 be 5.0 nm or less. An example of the results of measuring the outer diameter of the outermost walls of the plurality of CNTs constituting the CNT aggregate 11 is shown in the graphs of FIG. 3B. In FIG. 3B, the outer diameter of the outermost walls of all of the CNTs constituting the CNT aggregate is 5.0 nm or less. In particular, among all of the CNTs, CNTs with an outermost wall having an outer diameter of 2 nm to 2.9 nm constitute the greatest number of CNTs, and CNTs with an outermost wall having an outer diameter of 3 nm to 3.9 nm constitute the second greatest number of CNTs. If an outer diameter of the outermost wall of the CNTs constituting the CNT aggregate 11 exceeds 5.0 nm, it is undesirable since this results in the porosity due to gaps between CNTs and gaps at the innermost wall becoming large, which results in reduced conductivity.

<Among Peaks Due to G Band of Raman Spectrum in Raman Spectroscopy, G+/Gtotal Ratio Due to Semiconductor CNTs be 0.70 or Greater>

Figure 4:
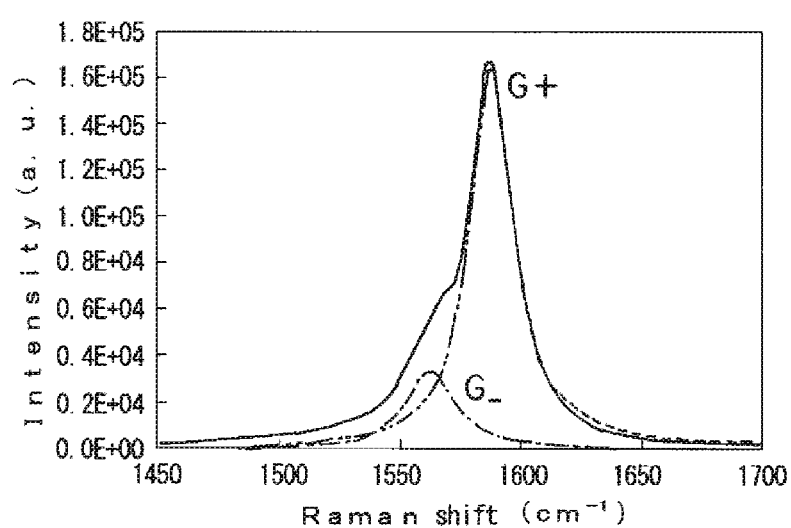
FIG. 4 is a graph for describing the G+/Gtotal ratio in the Raman spectrum of the carbon nanotube aggregate of the present embodiment.

When a carbon-based substance is analyzed by Raman spectroscopy, a peak in the spectrum resulting from in-plane oscillation of a six-membered ring, referred to as a G band, is detected in the vicinity of a Raman shift of 1590 cm$^{-1}$. Also, as shown in FIG. 4, CNTs have a tubular shape, and thus, the G band splits into two, and thus, there are two spectral peaks: G+ band and G− band. The spectral analysis results of FIG. 4 correspond to those of Working Example 1 to be described later. The G+ band corresponds to the longitudinal wave (LO) mode in the axial direction of the CNTs while the G− band corresponds to the transverse wave (TO) mode perpendicular to the axial direction. Whereas the peak of the G+ band appears in the vicinity of 1590 cm$^{-1}$ regardless of the outer diameter, the peak of the G− band shifts from the G+ band in a manner inversely proportional to the square of the outer diameter of the CNTs.

The G band of the metallic CNTs is split into the G+ band and the G− band as described above, but the peaks thereof are small, and the peak of the G+ band is particularly small. On the other hand, there is a split between the G+ band and the G− band in semiconductor CNTs as well, but the peak of the G+ band is very high compared to that of the G+ band of metallic CNTs. Thus, if the proportion of the G+ band in the G band is very high, it can be inferred that the CNTs behave as semiconductors, and a similar inference can be made for CNT aggregates as well.

Assuming spectral peak characteristics such as those described above, as shown in FIG. 4, in the CNT aggregate 11 of the present embodiment, among peaks due to the G band of the Raman spectrum, the proportion by area of G+ bands due to semiconductor CNTs in relation to Gtotal (G+/Gtotal ratio) is 0.70 or greater. If the G+/Gtotal ratio is less than 0.70, the proportion of semiconductor CNTs is low, and good conductivity from doping cannot be attained.

Figure 5A:
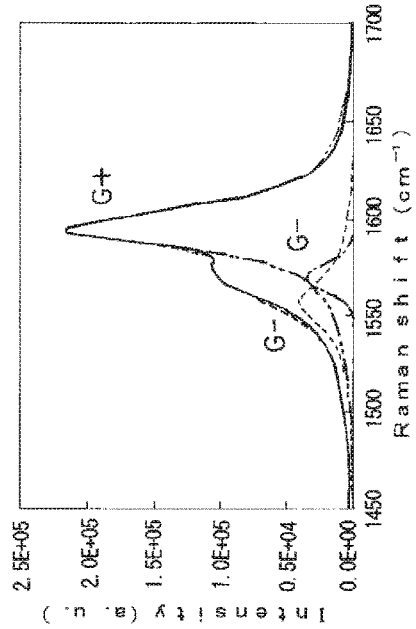
FIGS. 5A to 5D are graphs for describing the G+/Gtotal ratios of carbon nanotube aggregates that are outside the scope of the present invention.
Figure 5C:
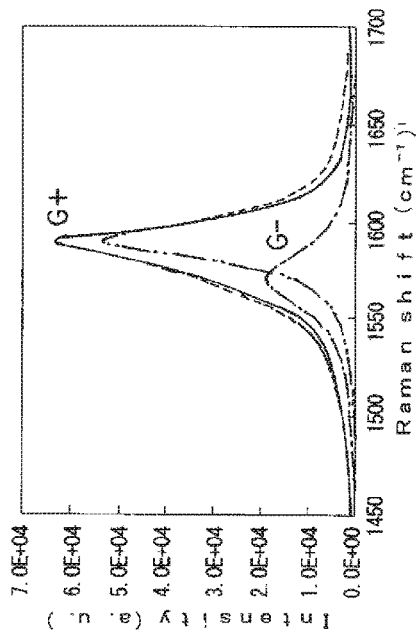
Figure 5B:
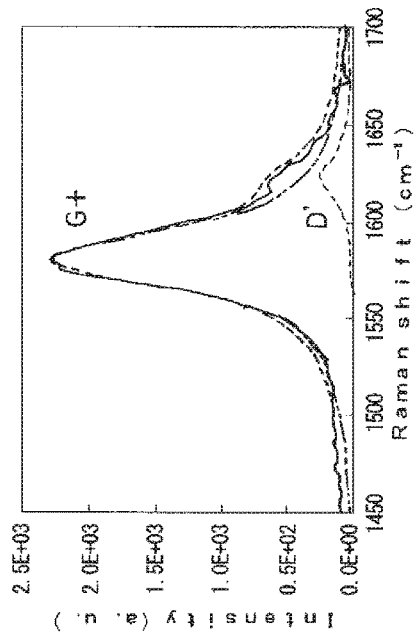
Figure 5D:
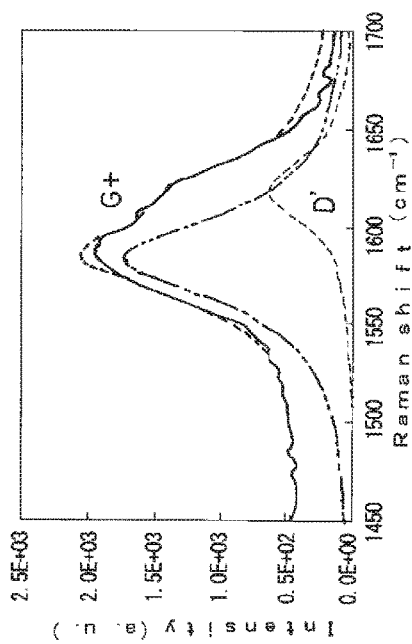

On the other hand, FIGS. 5A to 5D show G bands detected for CNT aggregates that are outside the scope of the present invention. The spectral analysis results of FIGS. 5A to 5D correspond to those of Comparison Examples 1 to 4 to be described later. In the CNT aggregate of FIG. 5A, the proportion of CNTs with a two- or three-walled structure is 86% and the G+/Gtotal ratio is 0.61; in the CNT aggregate of FIG. 5B, the proportion of CNTs with a two- or three-walled structure is 5% or less (most common number of walls for CNTs: 1), and the G+/Gtotal ratio is 0.70. Additionally, in the CNT aggregate of FIG. 5C, the proportion of CNTs with a two- or three-walled structure is 5% or less (most common numbers of walls for CNTs: 4-12) with no spectral peak of the G− band being detected; in the CNT aggregate of FIG. 5D, the proportion of CNTs with a two- or three-walled structure is 5% or less (most common numbers of walls for CNTs: 15 or greater) with no spectral peak of the G− band being detected. The resistivity of all of the CNT aggregates shown in FIGS. 5A to 5D is 1.3×10$^{-5}$ Ω·cm or greater, as will be described later. The D' bands appearing in FIGS. 5C and 5D are peaks resulting from defects, similar to D bands.

In the present embodiment, a G/D ratio, which is a ratio of the G band and the D band due to the crystallinity in the Raman spectrum, is defined. The D band appears in the vicinity of a Raman shift of 1350 cm$^{-1}$, and can also be said to be a peak due to defects. The ratio of D band to G band (G/D ratio) is used as an indicator for the amount of defects in the CNTs, and the greater the G/D ratio is, the fewer defects there are in the CNTs.

Figure 6A:
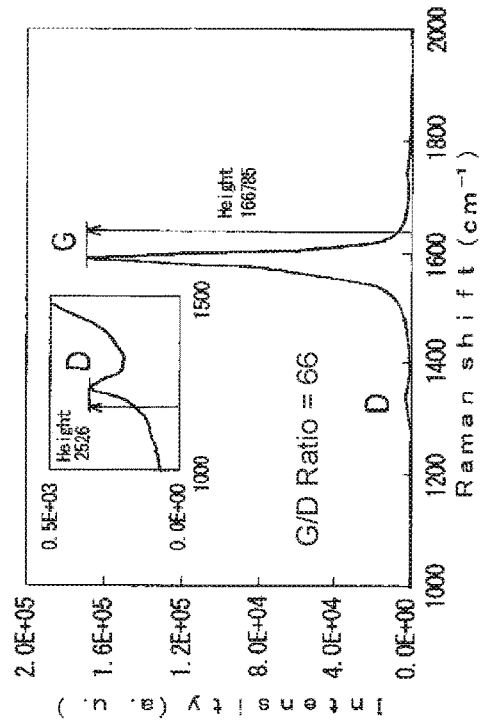
FIGS. 6A to 6D are graphs for describing the G/D ratios in the Raman spectrum of the carbon nanotube aggregate of the present embodiment.
Figure 6B:
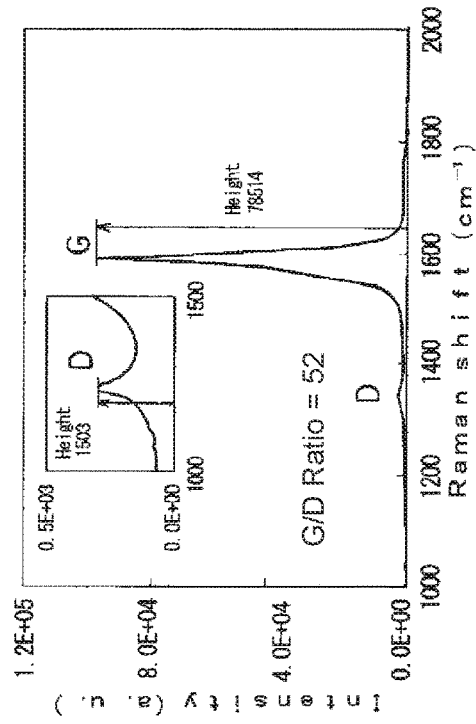
Figure 6C:
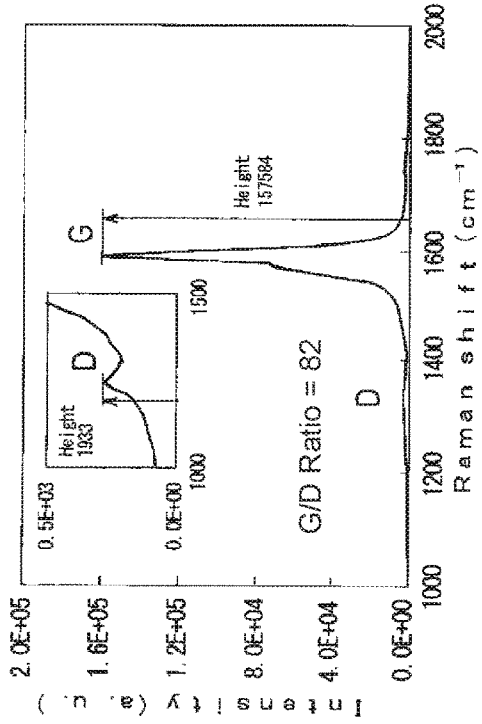
Figure 6D:
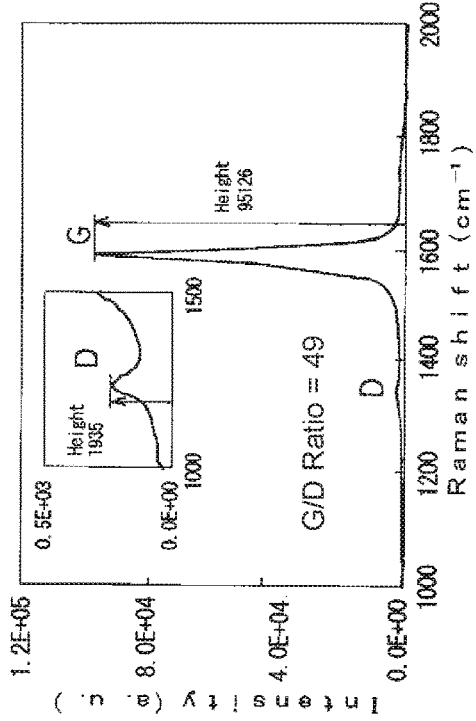
Figure 7B:
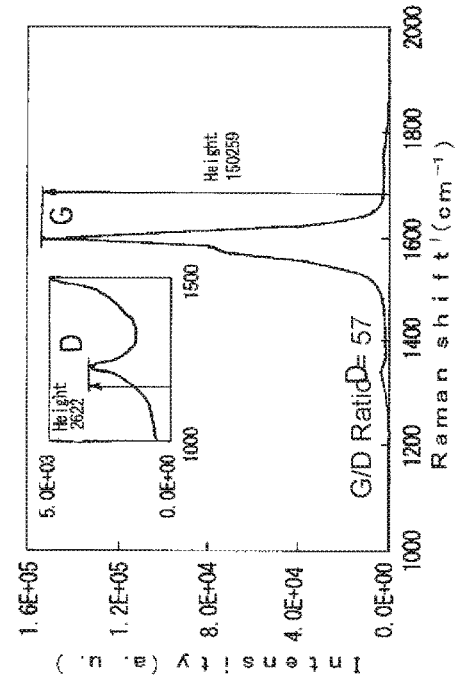
FIGS. 7A to 7D are graphs for describing the G/D ratio of carbon nanotube aggregates that are outside the scope of the present invention.
Figure 7A:
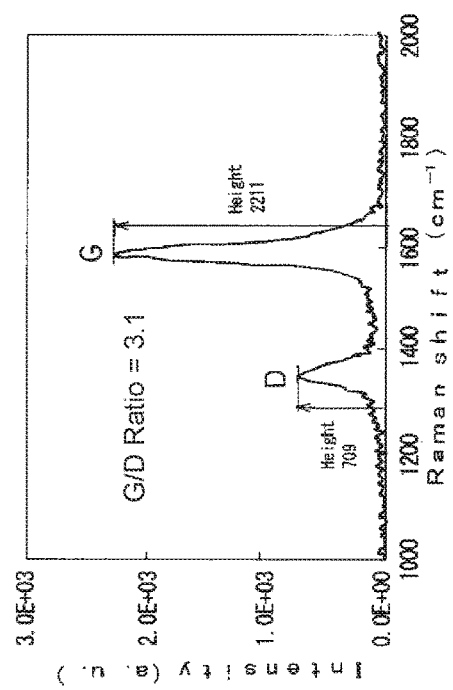
Figure 7D:
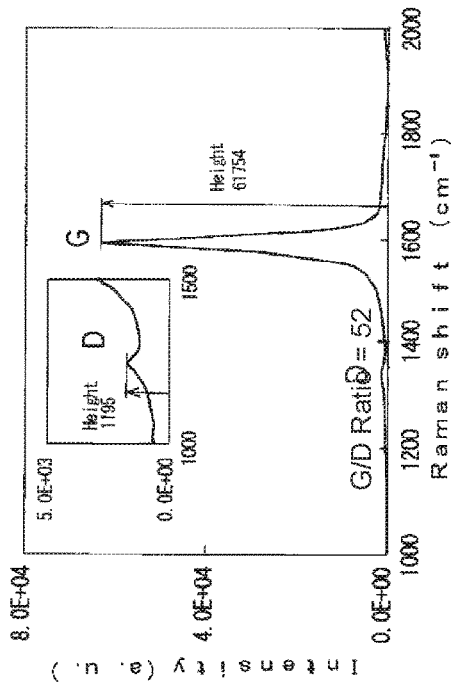
Figure 7C:
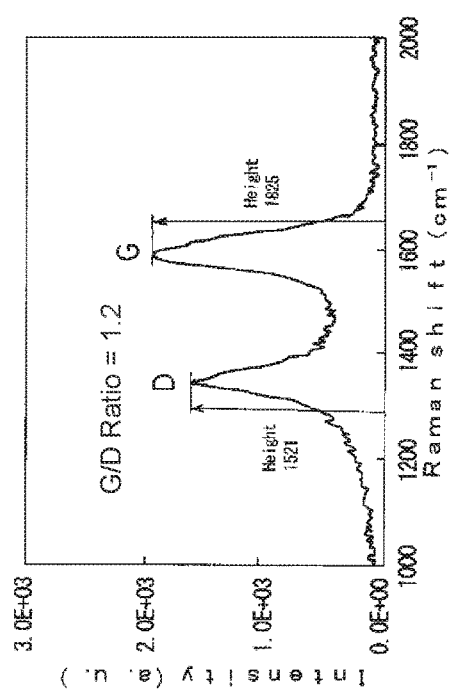

In the CNT aggregate 11 of the present embodiment, the G/D ratio, which is the ratio of the G band and the D band due to the crystallinity in the Raman spectrum, is 45 or greater. As shown in FIGS. 6A to 6D, as a result of detecting four points (n=1 to 4) in the CNT aggregate 11 with consideration for variation among the measurement samples, it was found that the G/D ratio for all four points is 45 or greater. Specifically, for n=1 the G/D ratio is 82 (FIG. 6A), for n=2 the G/D ratio is 66 (FIG. 6B), for n=3 the G/D ratio is 49 (FIG. 6C), and for n=4 the G/D ratio is 52 (FIG. 6D). If the G/D ratio is less than 45, then crystallinity is low and good conductivity cannot be attained.

FIGS. 7A to 7D are graphs for describing the G/D ratio in the Raman spectrum of carbon nanotube aggregates that are outside the scope of the present invention. The spectral analysis results of FIGS. 7A to 7D correspond to those of Comparison Examples 1 to 4 to be described later; in the comparison examples, a measurement for n=3 is made and the average thereof is determined for all samples with consideration for variation in the measurement values. That is, the graphs shown in FIGS. 7A to 7D each show one given point where n=3. In the CNT aggregate of FIG. 7A the G/D ratio is 52 and in the CNT aggregate of FIG. 7B the G/D ratio is 57; meanwhile, in the CNT aggregate of FIG. 7C the G/D ratio is 1.2 and in the CNT aggregate of FIG. 7D the G/D ratio is 3.1. In the CNT aggregates shown in FIGS. 7C and 7D, the average resistivity (n=3) is greater than or equal to $1.3 \times 10^{-5}$ Ω·cm as described later.

As described above, according to the present embodiment, by configuring the CNT aggregate 11 such that CNTs having a number of walls (two or three walls) that can bring about the maximum doping effects constitute 75% or greater and setting the G+/Gtotal ratio indicating the ratio of the number of semiconductor CNTs in relation to all the CNTs 11a constituting the CNT aggregate 11 to be 0.70 or greater, it is possible to achieve even lower resistance compared to conventional CNT wires, and it is also possible to achieve a substantially equivalent resistivity to the $1.68 \times 10^{-6}$ Ω·cm of copper and the $2.65 \times 10^{-6}$ Ω·cm of aluminum. Thus, it is possible to provide a CNT aggregate with greatly improved electrical characteristics.

<Carbon Nanotube Composite Material>

Figure 8A:
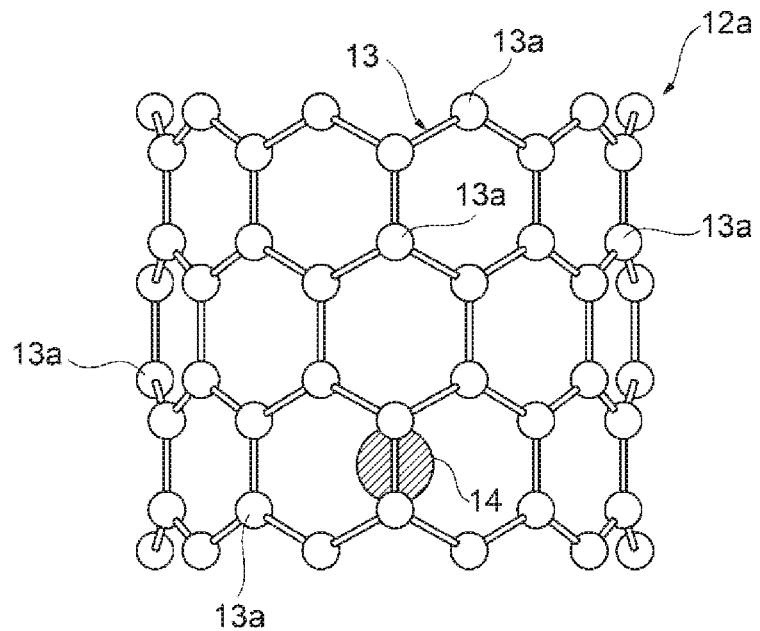
FIGS. 8A and 8B schematically show a carbon nanotube composite material according to an embodiment of the present invention.
Figure 8B:
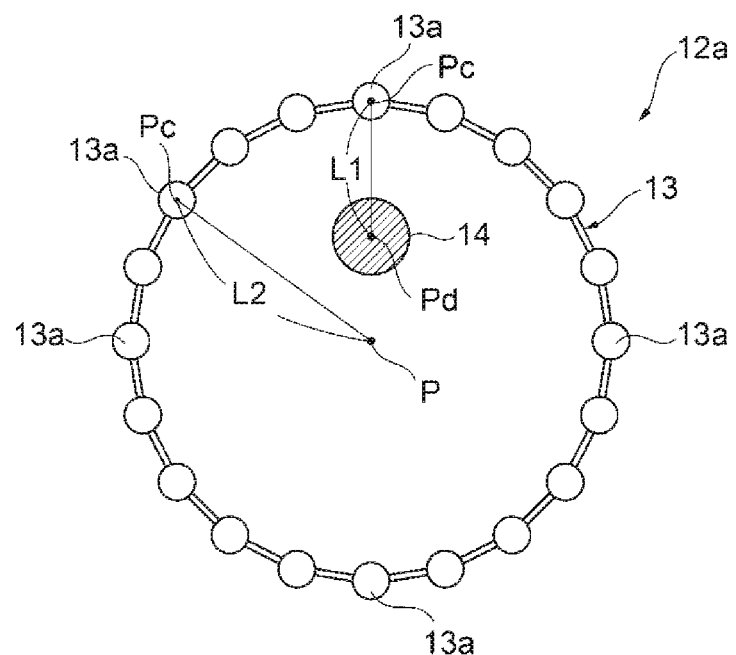

FIGS. 8A and 8B schematically show a carbon nanotube composite material according to an embodiment of the present invention; FIG. 8A is a partial plan view showing an example of a CNT composite material formed by doping a single-walled CNT with lithium, which is a doping element, and FIG. 8B is a side view thereof.

As shown in FIGS. 8A and 8B, the CNT composite material 12a includes a CNT 13 having a single-walled structure and a doping element 14 included inside the CNT. In the present embodiment, CNTs 13 doped with the doping element 14 will be referred to as the CNT composite material. By placing an atom of the doping element 14 inside the CNT 13, it is possible to generate many carriers inside the CNT 13.

In the CNT composite material 12a, a minimum distance L1 between center positions Pc of the carbon atoms 13a constituting the CNT 13 and a center position Pd of the atom of the doping element 14 is less than a distance L2 between the center positions Pc of the carbon atoms 13a and a center position P of the CNT 13 in a cross-section taken in the radial direction (FIG. 8B). It is preferable that the minimum distance L1 between the carbon atoms 13a constituting the CNT 13 and the atom of the doping element 14 be 2.0 angstroms (Å) to 4.0 angstroms, inclusive. With the minimum distance L1 between the carbon atoms 13a and the atom of the doping element 14 being set to within that range, charge transfer can occur more easily, and more carriers resulting from conductivity are generated in the CNT 13.

The CNT composite material 12a can be produced by heating the CNTs for a few hours at a high temperature in a vapor containing the doping atoms, for example. As a result, it is possible to attain a CNT composite material in which the center position Pd of the atom of the doping element 14 is offset from the center position P of the CNT 13.

Figure 9:
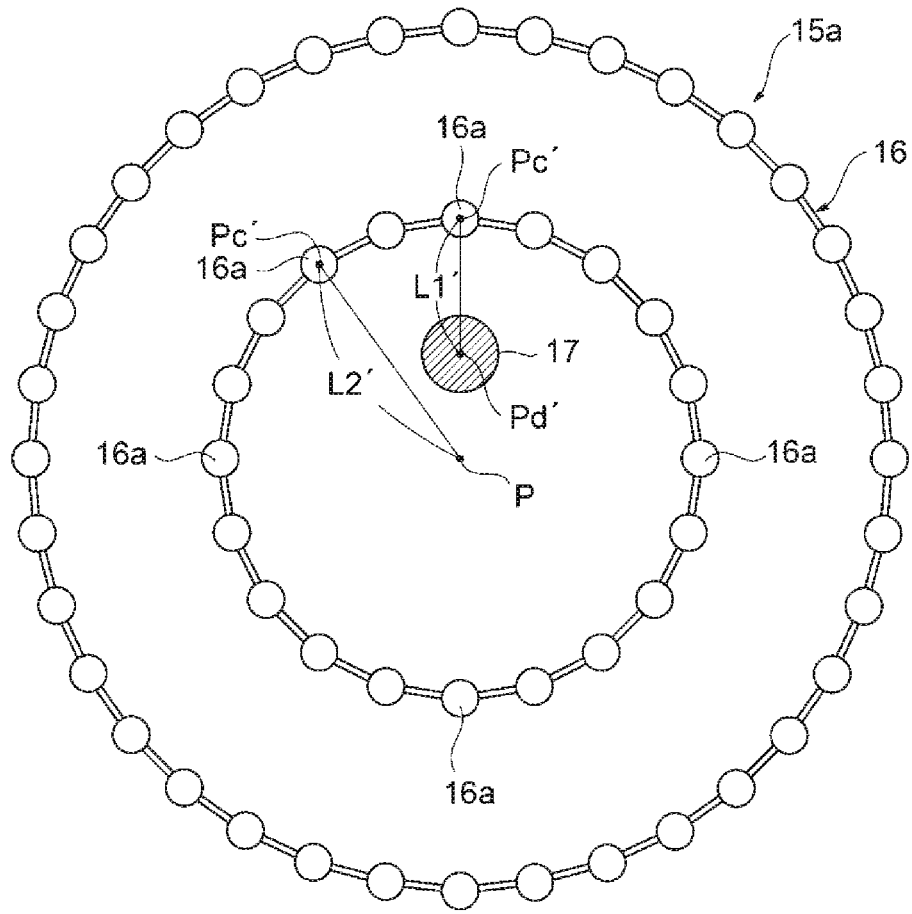
FIG. 9 is a side view showing an example of a CNT composite material formed by doping a CNT having a multi-walled structure with lithium.

As shown in FIGS. 8A and 8B, the atom of the doping element 14 is located in the single-walled CNT 13, but the configuration is not limited thereto, and as shown in FIG. 9, a CNT composite material 15a may include a CNT 16 having a multi-walled structure and a doping element 17 that is different from carbon and included inside the innermost wall 16-1 among the multiple walls. Also, it is preferable that the CNT composite material include CNTs having a two- or three-walled structure and a doping element positioned in the innermost wall of the wall structure. In this case, a minimum distance L1' between center positions Pc' of the carbon atoms 16a constituting the innermost wall 16-1 of the CNT 16 and a center position Pd' of the atom of the doping element 17 is less than a distance L2' between the center positions Pc' of the carbon atoms 16a and a center position P' of the innermost wall 16-1 in a cross-section taken in the radial direction.

It is preferable that the minimum distance L1' between the carbon atoms 16a constituting the CNT 16 and the atom 17 of the doping element be 2.0 angstroms (Å) to 4.0 angstroms, inclusive. With the minimum distance L1' being set to within that range, charge transfer can occur more easily and more carriers are generated inside the innermost wall 16-1, similar to what was described above.

In the CNT composite material configured as described above, if the CNT structure is the same, electric characteristics of the CNT composite material can be made to differ depending on the doping element with which the CNT is doped. In the present embodiment, a single-walled CNT was used, and a simulation by first principles calculation was performed with a focus on doping elements primarily belonging to group 1, group 2, and group 17 of the periodic table, and the following calculation and evaluation was performed for (i) the stability of the dopant (doping element), (ii) the charge transfer amount, and (iii) the mass increase ratio.

The simulation by first principles calculation used the Kohn-Sham equation based on density functional theory (DFT). In density functional theory, by expressing the exchange-correlation potential, which represents the mutual effect between electrons, using a functional of electron density, it is possible to increase the speed of calculating the electron state. Also, the exchange-correlation potential was expressed by generalized gradient approximation (GGA), and additionally, a plane-wave basis function having a cutoff energy of 50 Ryd was used. The cutoff energy pertains to the number of wave functions used for calculation and the number of wave functions is proportional to the 3/2 power of the cutoff energy. The k point sampling number was set to 1×1×8. Calculation was performed using "Quantum-ESPRESSO" as the calculation software.

Stability was evaluated such that an adsorption energy of −1.0 eV or less was deemed good (O), an adsorption energy of not less than −1.0 eV and less than 0.0 eV was deemed somewhat good (Δ), and an adsorption energy of 0.0 eV or greater was deemed bad (x).

Charge transfer amount is evaluated by calculating the charge transfer amount (number/dopant) between the carbon atoms constituting the CNT and the atom of the doping element positioned at the closest position to the carbon atoms. Specifically, by using software that performs the first principles calculation, the CNT structure (distance) is refined, and the charge transfer amount at this time is calculated. If the charge transfer amount between the dopant and the CNT is 1.2 or greater per dopant, it was evaluated as very good (⊚), if the charge transfer amount is not less than 0.8/dopant and less than 1.2/dopant, it was evaluated as good (O), if the charge transfer amount is not less than 0.5/dopant and less than 0.8/dopant, it was evaluated as somewhat good (Δ), and if the charge transfer amount is less than 0.5/dopant, then it was evaluated as bad (x).

The mass increase ratio was calculated by determining the ratio of the mass of the CNT composite material in relation to the mass of the CNT for when the carrier density is $1.0 \times 10^{21}/cm^3$ (carrier density corresponding to metallic CNT).

Figure 10A:
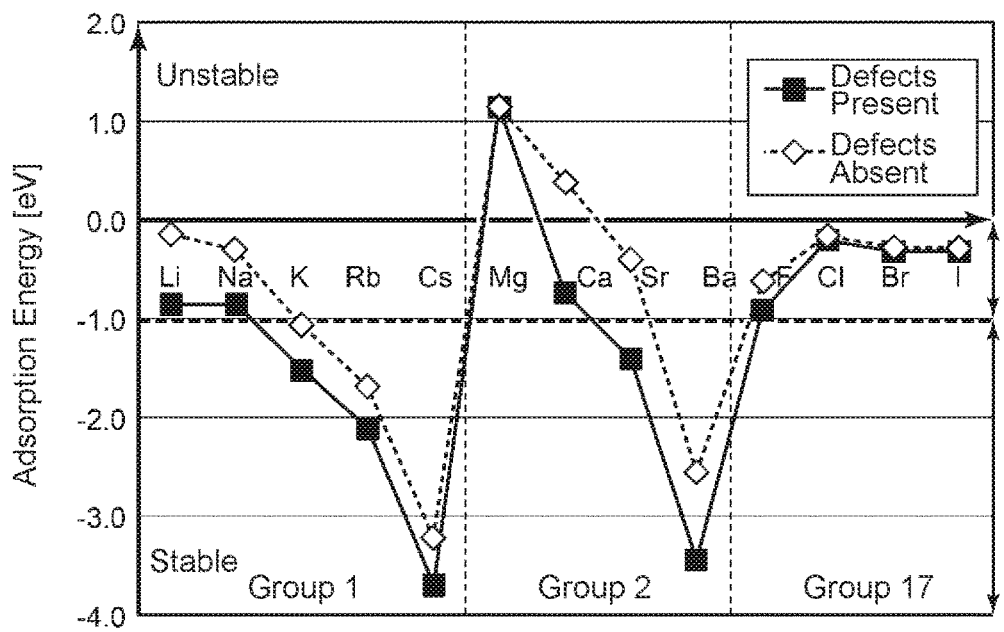
FIGS. 10A and 10B show characteristics, for each of the doping elements, of carbon nanotube composite materials doped with the various doping elements.
Figure 10B:
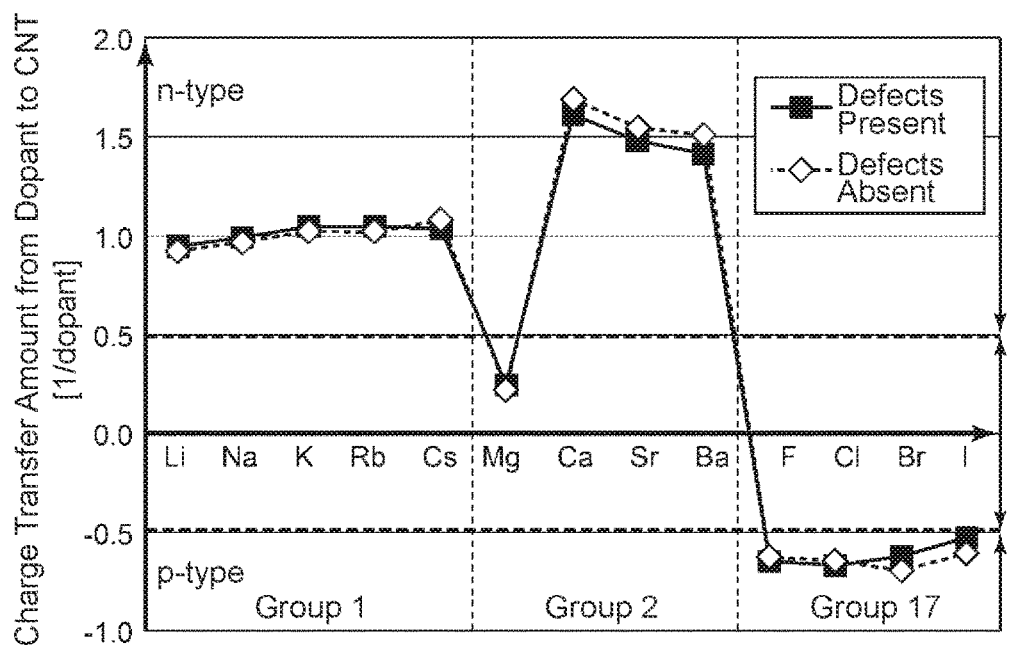

First, the stability of the dopant when a CNT with no defects is used is indicated in Table 1 and in FIG. 10A with the broken line. Also, the results of calculating the charge transfer amount and the mass increase ratio when a CNT with no defects is used are indicated in Table 2 and in FIG. 10B with the broken line.

cesium (Cs), strontium (Sr), barium (Ba), fluorine (F), chlorine (Cl), bromine (Br), or iodine (I), the adsorption energy is less than 0.0 eV and the dopant has good stability, and a stable dopant being placed in the CNT makes it possible to stably exhibit characteristics such as temperature characteristics necessary for electrical wires. In particular, if the dopant is potassium, rubidium, cesium, or barium, the adsorption energy is less than −1.0 eV, and thus, it can be seen that the dopant stability is even better.

Also, if the dopant is lithium, sodium, potassium, rubidium, cesium, strontium, barium, fluorine, chlorine, bromine, or iodine, then the absolute value of the charge transfer amount from the dopant to the CNT is 0.5/dopant or greater, and thus, it is found that the charge transfer amount and the conductivity within the CNT are good.

At this time, the ratio of the mass of the CNT composite material to the mass of the CNT constituting the CNT composite material (mass increase ratio) is 1.007 to 1.197 when the CNTs are doped with a dopant selected from among the above group, and as a result, a carrier density equivalent to metallic CNTs can be attained (Table 1).

Next, the stability of the dopant for when a CNT having defects is used is indicated in Table 2 and in FIG. 10A with the solid line. Also, the results of calculating the charge transfer amount and the mass increase ratio for when a CNT having defects is used are indicated in Table 2 and in FIG. 10B with the solid line.

TABLE 1

| Dopant | Li | Na | K | Rb | Cs | Mg | Ca | Sr | Ba | F | Cl | Br | I |
|---|---|---|---|---|---|---|---|---|---|---|---|---|---|
| Stability | Δ | Δ | O | O | O | X | X | Δ | O | O | Δ | Δ | Δ |
| Charge Transfer Amount | O | O | O | O | O | X | ⊚ | ⊚ | ⊚ | Δ | Δ | Δ | Δ |
| Mass Increase Ratio (CNT Composite Material/CNT) | 1.007 | 1.023 | 1.038 | 1.080 | 1.120 | 1.112 | 1.023 | 1.055 | 1.088 | 1.029 | 1.051 | 1.109 | 1.197 |

As a result, it was determined that when the dopant is lithium (Li), sodium (Na), potassium (K), rubidium (Rb),

TABLE 2

| Dopant | Li | Na | K | Rb | Cs | Mg | Ca | Sr | Ba | F | Cl | Br | I |
|---|---|---|---|---|---|---|---|---|---|---|---|---|---|
| Stability | Δ | Δ | O | O | O | X | Δ | O | O | O | Δ | Δ | Δ |
| Charge Transfer Amount | O | O | O | O | O | X | ⊚ | ⊚ | ⊚ | Δ | Δ | Δ | Δ |
| Mass Increase Ratio (CNT Composite Material/CNT) | 1.007 | 1.023 | 1.036 | 1.079 | 1.125 | 1.100 | 1.024 | 1.057 | 1.095 | 1.028 | 1.049 | 1.122 | 1.226 |

As a result, it is possible to place a dopant inside CNTs with defects as well, and if the dopant is lithium, sodium, potassium, rubidium, cesium, calcium (Ca), strontium, barium, fluorine, chlorine, bromine, or iodine, then the adsorption energy is less than 0.0 eV, and thus, the charge transfer amount is 0.5/dopant or greater. Also, at this time, the ratio of the mass of the CNT composite material to the mass of the CNT is 1.007 to 1.226. Thus, it is found that even if CNTs with defects are used, the stability of the dopant and the conductivity inside the CNTs are good, and more dopant can be used to dope the CNTs.

Also, when CNTs having defects are doped with a doping element, then compared to a case in which the same doping element is used to dope CNTs with no defects, the adsorption energy of the CNT composite material using CNTs having defects is reduced, and thus, it can be inferred that by adsorbing the dopants to the defects, the stability of the dopants is further improved. Thus, in the CNT composite material according to the present invention, it was shown that certain effects are attained in realizing high conductivity even when using a CNT composite material with defects.

Thus, it can be seen from the results of Tables 1 and 2 that if (a) the dopant is an element selected from among a group including lithium, sodium, potassium, rubidium, cesium, calcium, strontium, barium, fluorine, chlorine, bromine, and iodine, then, if (b) the charge transfer amount between carbon atoms constituting the CNT and the atom of the dopant located at the closest position is 0.5/dopant or greater; and if (c) the ratio of the mass of the CNT composite material to the mass of the CNT is 1.005 to 1.25, and as a result, the dopant has good stability, the conductivity within the CNTs is good, and more dopant can be used to dope the CNTs.

To evaluate the charge transfer amount in actual materials, the methodology disclosed in an article, P. Puech, et al., "Charge transfer between carbon nanotubes and sulfuric acid as determined by Raman spectroscopy", Phys. Rev. B 85, 205412 (May 9, 2012), should be used. The mass of the CNT composite material to the mass of the CNT for actual materials should be measured by taking a ratio of the measured mass of the CNT composite material with the dopant to the measured mass of the CNT with the dopant one-by-one.

As described above, in the present embodiment, the CNT composite material includes the CNT 13 having a wall structure with one or more walls and the doping element 14 included inside the CNT, and the minimum distance L1 between the center positions Pc of the carbon atoms 13a constituting the CNT 13 and the center position Pd of the atom of the doping element 14 is less than the distance L2 between the center positions Pc of the carbon atoms 13a constituting the CNT 13 and the center position P of the CNT 13 in a cross-section taken in the radial direction. As a result, carriers are generated in the CNT 13 and the amount of carriers contributing to conductivity can be increased, and thus, it is possible to realize enhanced conductivity than in a conventional doped CNT composite materials, and it is possible to provide the CNT composite material 12a with greatly improved electrical characteristics.

<Method of Manufacturing Carbon Nanotube Aggregate>

The CNT aggregate of the present embodiment is manufactured by the method below. First, by floating catalytic chemical vapor deposition (CCVD), a mixture including a catalyst and a reaction accelerator is provided to a carbon source to generate a plurality of CNTs. At this time, it is possible to use a saturated hydrocarbon having a six-membered ring for the carbon source, a metal catalyst such as iron for the catalyst, and a sulfur compound for the reaction accelerator. Also, in the present embodiment, with consideration for the fact that as the carrier gas flow rate increases, the proportion of SWNTs decreases, the proportion of CNTs having two- or three-walled structures is increased by adjusting the raw material composition and the spraying conditions.

Also, in order to adjust the size of the iron, which is a catalyst, so that the outer diameter of the outermost wall of the CNT is 5.0 nm or less, the raw material is sprayed into a reactor such that the mist particle diameter is approximately 20 μm. Then, the plurality of CNT bundles are intertwined to form the CNT aggregate.

Then, by performing acid treatment on the CNT aggregate, any remaining iron catalyst is eliminated. Within the CNT aggregate formed by CCVD, a large amount of catalyst, amorphous carbon, and the like is included, and by performing a high purification process to remove these, the intended characteristics of the CNT aggregate can be attained. In the present embodiment, the CNTs attained by the above steps is heated to a prescribed temperature in air, and the CNTs that were heated are highly purified using a strong acid.

Next, the CNT aggregate that has undergone acid treatment is subjected to doping. In the doping process, it is preferable that doping be performed using at least one doping element or molecule selected from a group including nitric acid, sulfuric acid, iodine, bromine, potassium, sodium, boron, and nitrogen, and it is more preferable that doping be performed using nitric acid. Also, a plurality of carbon nanotubes may be doped with a doping element selected from among a group including lithium, rubidium, cesium, calcium, strontium, barium, fluorine, chlorine, bromine, and iodine. Since the dopant is injected into the CNTs from the outside, if the CNT has a multi-walled structure (MWNTs), then the outermost wall is preferentially doped and the inner walls are difficult to be doped. Thus, in the present embodiment, on the basis of the inference that first to third walls are doped to a greater degree and fourth and more walls are doped to a lesser degree, by having the proportion by number of CNTs with a two- or three-walled structure being 75% or more, it is possible to increase the doping amount of the CNT aggregate as a whole, thereby attaining excellent doping effects.

<Electrical Characteristics of Carbon Nanotube Aggregate>

In the CNT aggregate of the present embodiment attained by the manufacturing method above, the resistivity is $6.9 \times 10^{-6}$ Ω·cm or less. This is approximately a 45% reduction in resistivity compared to the minimum resistivity of $1.55 \times 10^{-5}$ Ω·cm attained in the conventional technique. Although this resistivity is somewhat higher than the $1.68 \times 10^{-6}$ Ω·cm resistivity of copper or the $2.65 \times 10^{-6}$ Ω·cm resistivity of aluminum, the resistivity is still of the same order of magnitude ($\times 10^{-6}$). Thus, if the CNT aggregate of the present embodiment is used as a wiring material instead of copper or aluminum, then it is possible to maintain a comparable resistivity to that of copper and aluminum while achieving reduced weight.

A CNT aggregate and a CNT composite material according to embodiments of the present invention was described above, but the present invention is not limited to the embodiments, and various changes and modifications can be made on the basis of the technical concept of the present invention.

For example, a CNT-covered electrical wire including a carbon nanotube wire made by bundling the CNT aggregate of the embodiment above, and a cover layer that covers the outside of the carbon nanotube wire may be configured. In particular, the CNT aggregate and the CNT composite material of the present embodiment are suitable as a material for wires for electric lines for transmitting power or signals, and are even more suitable as a material for wires for electric lines installed in a moving body such as a four-wheeled vehicle. This is due to the fact that the wires would be lighter weight than metal electric lines, which means that improved fuel economy can be anticipated.

Also, a wire harness having at least one carbon nanotube covered electric line may be configured.

WORKING EXAMPLES

Below, working examples of the present invention will be explained. The present invention is not limited to the working examples below.

Working Examples 1-2

Figure 11:
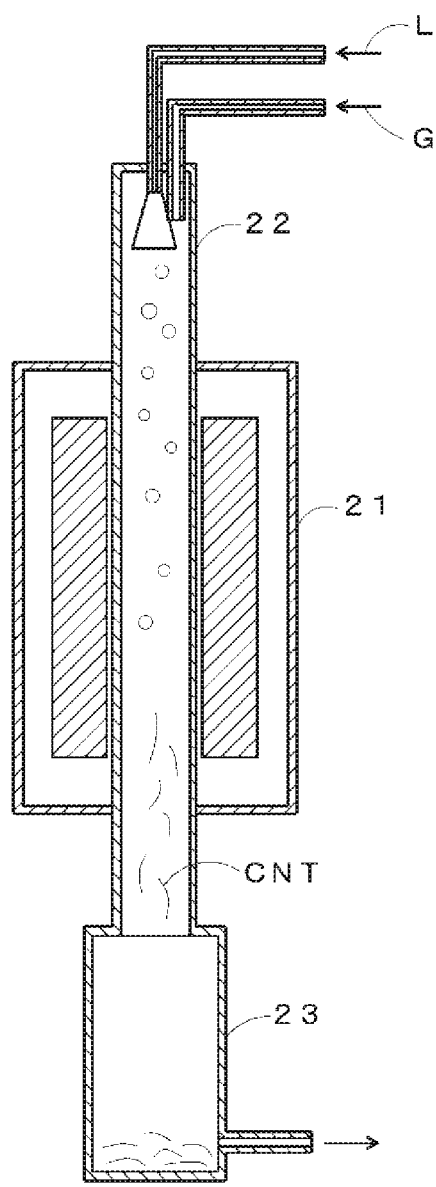
FIG. 11 shows an example of a manufacturing device that manufactures carbon nanotubes by floating catalytic chemical vapor deposition.
Figure 12A:
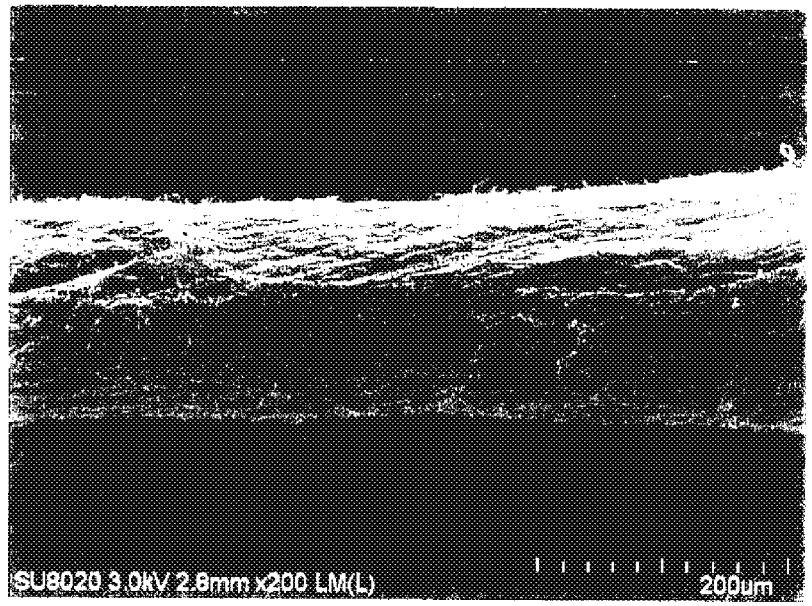
FIGS. 12A and 12B are electron microscope images of a carbon nanotube aggregate produced in Working Example 1.

In a CNT manufacturing device as shown in FIG. 11, floating catalytic chemical vapor deposition (CCVD) was used such that a raw material solution L containing decahydronaphthalene as the carbon source, ferrocene as the catalyst, and thiophene as the reaction accelerator was provided by spraying into an alumina pipe 22 with an internal diameter Φ of 60 mm and a length of 1600 mm that was heated to 1300° C. by an electric furnace 21. As a carrier gas G, hydrogen was provided at 9.5 L/min. The CNT that was produced was collected in sheet form by a collector 23, and this sheet was wound and twisted to produce the CNT aggregate. Next, the CNT aggregate that was produced was heated to 500° C. in air, and then highly purified by performing acid treatment thereon. Then, nitric acid doping was performed on the highly purified CNT aggregate. A CNT aggregate with a diameter of approximately 180 µm as shown in FIG. 12A was attained.

Next, the structure and characteristics of the CNT aggregate were measured and evaluated by the method below.

Figure 12B:
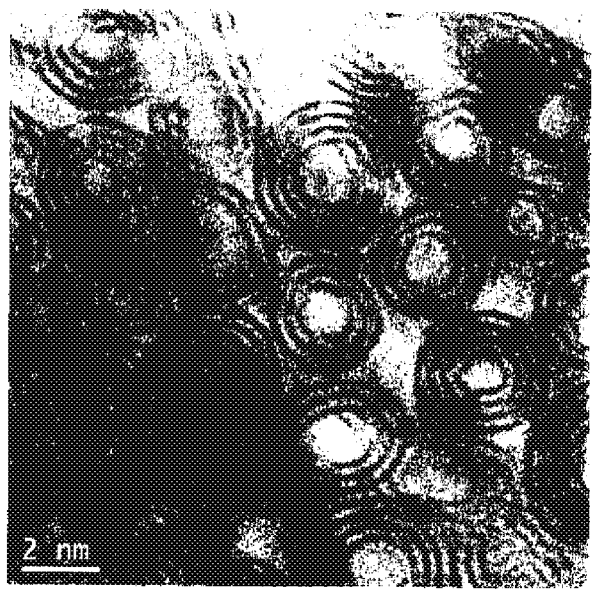

(a) Measurement of Number of Walls and Outer Diameter of CNTs Constituting CNT Aggregate The cross-section of the CNT aggregate generated under the above conditions was observed and analyzed under a transmission electron microscope as shown in FIG. 12B, and the number of walls of each of the approximately 200 CNTs and the outer diameter of the CNTs located in the outermost area of the CNT aggregate were measured.

(b) Measurement of G+/Gtotal Ratio and G/D Ratio of CNT Aggregate

A Raman spectrum was obtained by performing measurements using a Raman spectroscopy device (made by Thermo Fisher Scientific Inc.; product name "Almegra XR") under the following conditions: excitation laser of 532 nm; laser intensity reduced to 10%; objective lens with 50× magnification; and exposure time of 1 second×60 times. Next, a spectral analysis software "Spectra Manager" made by JASCO Corporation was used to extract data in the range of 1000 to 2000 $cm^{-1}$ from the Raman spectrum, and to perform resolved analysis on a group of peaks detected in this range using curve fitting. The baseline is a line connecting the detection intensities at 1000 $cm^{-1}$ to 2000 $cm^{-1}$. The curve fitting is performed using the Voigt profile. Within the G bands, the peak detected at the strongest intensity near 1590 $cm^{-1}$ is the G+ band, and the peak observed at a lower frequency near the range of 1550 to 1590 $cm^{-1}$ is the G− band, and where Gtotal is defined to be "area of G+ peak+area of G− peak", the ratio of G+/Gtotal was calculated. The G/D ratio was calculated according to the peak top heights of the G band and the D band (detection intensity calculated by subtracting baseline value from peak top) from the Raman spectrum extracted in a similar manner to that described above.

(c) Resistivity Measurement for CNT Composite Material

The CNT composite material was connected to a resistance measurement device (made by Keithley; product name "DMM 2000") and the resistance was measured by four-terminal sensing. The resistivity was calculated on the basis of the formula r=RA/L (R: resistance; A: cross-sectional area of CNT aggregate; L: measurement length).

Comparison Examples 1-4

A CNT composite materials were produced by the conventional technique in each of Comparison Examples 1 to 4. The number of walls and outer diameters of the CNTs in the produced CNT aggregate, the resistivity of the CNT aggregate, and the G/D ratio and G+/Gtotal ratio were measured by a similar method to the working examples. In each comparison example, three points were measured (n=3) and the average thereof was determined.

The measurement results of Working Examples 1 and 2 and Comparison Examples 1 to 4 are shown in Table 3.

TABLE 3

|  | Working Example 1 | Working Example 2 | Comparison Example 1 | Comparison Example 2 | Comparison Example 3 | Comparison Example 4 |
|---|---|---|---|---|---|---|
| Proportion of CNTs (%) with 2-or 3-walled structure | 85 | 78 | 86 | 5 or less | 5 or less | 5 or less |
| Raman spectrum G/D ratio | 73 | 47 | 66 | 42 | 1.3 | 2.2 |
| Raman spectrum G+/Gtotal ratio | 0.81 | 0.77 | 0.61 | 0.70 | (G− peak not detected) | (G− peak not detected) |
| Resistivity (Ω · cm) | $6.3 \times 10^{-6}$ | $6.9 \times 10^{-6}$ | $1.3 \times 10^{-5}$ | $2.1 \times 10^{-4}$ | $3.9 \times 10^{-4}$ | $7.0 \times 10^{-4}$ |

Note:
Bold italic numbers indicate values that are outside the appropriate range of the present invention.

In Working Examples 1 and 2, clear spectral peaks due to a G band and D band near the range of 1000 to 2000 $cm^{-1}$ were observed. From the results of Table 1, it was found that in Working Example 1, the amount of single-walled CNTs was small, and 85% of the CNTs had a two- or three-walled structure (FIG. 3A). Also, the diameters of the CNTs located in the outermost areas of the generated CNT aggregate were 5.0 nm or less (FIG. 3B). The G/D ratio, which is an indicator of crystallinity of the CNT, was 73, the G+/Gtotal ratio attained on the basis of the G+ band (1589 $cm^{-1}$) and the G– band (1563 cm$^{-1}$) was 0.81, and the resistivity at that time was 6.3×10$^{-6}$ Ω·cm, which is lower than in conventional configurations.

In Working Example 2, the proportion of CNTs having a two- or three-walled structure was 78%, the G/D ratio was 47, the G+/Gtotal ratio was 0.77, and the resistivity was 6.9×10$^{-6}$ Ω·cm, and thus, similar to Working Example 1, a resistivity lower than that in conventional configurations was attained.

On the other hand, in Comparison Example 1, the proportion of CNTs having a two- or three-walled structure was 86%, the G/D ratio was 66, and the G+/Gtotal ratio was 0.61; the G+/Gtotal ratio is outside of the range of the present invention, and thus, the resistivity deteriorated to 1.3×10$^{-5}$ Ω·cm.

In Comparison Example 2, the proportion of CNTs having a two- or three-walled structure was 5% or less (most CNTs had a single-walled structure), the G/D ratio was 42, and the G+/Gtotal ratio was 0.70; the proportion of CNTs having a two- or three-walled structure is outside of the range of the present invention, and thus, the resistivity deteriorated to 2.1×10$^{-4}$ Ω·cm.

In Comparison Example 3, the proportion of CNTs having a two- or three-walled structure was 5% or less (most CNTs had a four- to twelve-walled structure), the G/D ratio was 1.3, and the G+/Gtotal ratio was incalculable (spectral peaks of G band not detected); the proportion of CNTs having a two- or three-walled structure, the G/D ratio, and the G+/Gtotal ratio are outside of the range of the present invention, and thus, the resistivity deteriorated to 3.9×10$^{-4}$ Ω·cm.

In Comparison Example 4, the proportion of CNTs having a two- or three-walled structure was 5% or less (most CNTs had a structure with 15 or more walls), the G/D ratio was 2.2, and the G+/Gtotal ratio was incalculable (spectral peaks of G band not detected); the proportion of CNTs having a two- or three-walled structure, the G/D ratio, and the G+/Gtotal ratio are outside of the range of the present invention, and thus, the resistivity deteriorated to 7.0×10$^{-4}$ Ω·cm.

Working Examples 3-4

Next, a CNT aggregate produced by a similar manufacturing method to that of Working Example 1 was prepared, and the CNT aggregate was doped with iodine instead of the nitric acid, which was the dopant for Working Example 1. Also, in Working Example 4, aside from doping being performed with potassium, the CNT composite material was manufactured by the same method to Working Example 3.

Comparison Examples 5-7

In Comparison Example 5, the CNT aggregate was manufactured by the same method to that of Working Example 1, but was not doped. In Comparison Example 6, a CNT composite material doped with iodine was manufactured in the same manufacturing method to Working Example 2, and the iodine dopant was positioned closer to the center of the innermost wall of the CNTs having the two- or three-walled structure compared to the CNT composite material of Working Example 2. In Comparison Example 7, a CNT composite material similar to Working Example 3 was manufactured except that potassium was used as the dopant, and the potassium dopant was positioned closer to the center of the innermost wall of the CNTs having the two- or three-walled structure.

In Working Examples 3 and 4 and Comparison Examples 5 to 7, the minimum distance between the innermost wall of the CNTs constituting the CNT composite material and the dopant was calculated by the method below. Also, the resistivity of the CNT composite material was measured and evaluated by the same method to that described above.

(d) Calculation of Minimum Distance between Innermost Wall of CNT and Dopant Regarding the CNT composite material generated in Working Examples 3 and 4, a simulation by first principles calculation was performed using single-walled CNTs, and the minimum distance between the innermost wall of the CNT and the dopant in each CNT composite material was calculated and evaluated.

The simulation for first principles calculation was performed using the calculation software "Quantum-ESPRESSO", and the Kohn-Sham equation based on density functional theory (DFT) was used. Also, the exchange-correlation potential was expressed by GGA. Additionally, a plane-wave basis function having a cutoff energy of 50 Ryd was used. Calculation was performed with the k point sampling number being set to 1×1×8.

For confirmation, the minimum distance between the innermost wall of the CNT and iodine was measured and compared with the calculated value. Using CNTs having a two- or three-walled structure that were doped with iodine, a measurement of approximately 200 points was performed randomly from a TEM image of the CNT cross section after doping to determine the minimum distance. As a result, the margin of error in the calculated value of the minimum distance by simulation was less than 10% compared to the measured value (actual measured value) of the minimum distance, and thus, it was found that the calculated value and the actual measured value were substantially the same.

<Table 4>

Figure 13A:
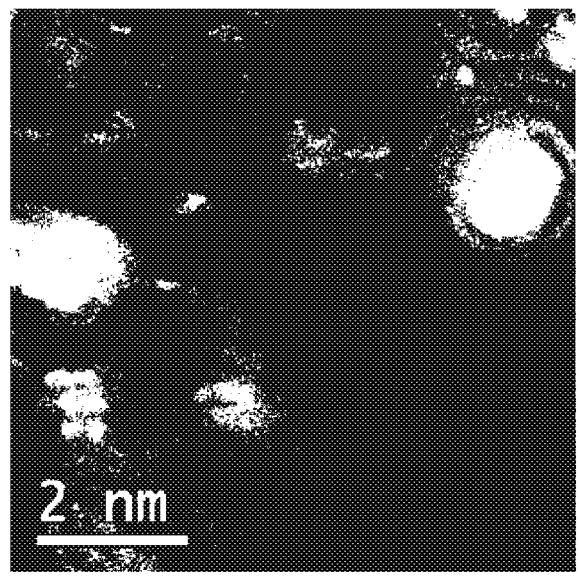
FIGS. 13A and 13B are electron microscope images of a carbon nanotube composite material formed by doping the carbon nanotube aggregate produced in Working Example 3.
Figure 13B:
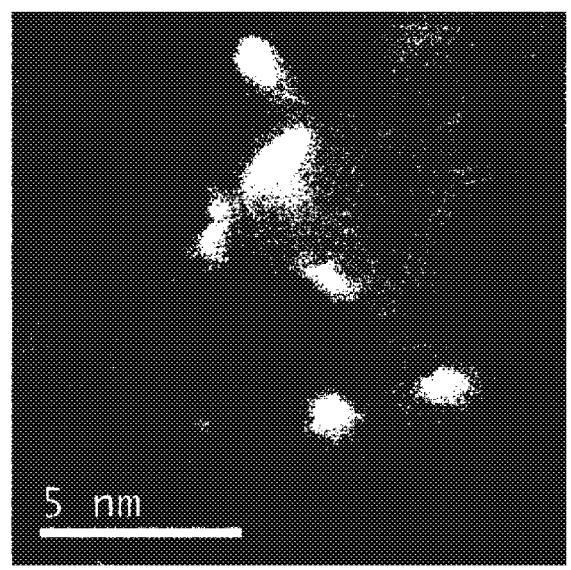

As shown in Table 4, in Working Example 3, it was confirmed that iodine was located at the innermost wall of the CNT as shown in FIG. 13A. Also, the minimum distance between the innermost wall of the CNTs and the iodine atom as the dopant was 3.61 Å, and the resistivity was 8.9×10$^{-6}$ Ω·cm. In Working Example 4, it was confirmed that potassium was located at the innermost wall of the CNT as shown in FIG. 13B. Also, the minimum distance between the innermost wall of the CNTs and the potassium as the dopant was 2.98 Å, and the resistivity was 9.6×10$^{-6}$ Ω·cm.

On the other hand, in Comparison Example 5, the resistivity was 7.8×10$^{-5}$ Ω·cm, which is worse than in Working Examples 3 and 4. Also, in Comparison Example 6, the iodine was located closer to the center of the innermost wall of the CNT than in Working Example 3 and the resistivity was 5.2×10$^{-5}$ Ω·cm, which is worse than in Working Examples 3 and 4. Also, in Comparison Example 7, the potassium was located closer to the center of the innermost wall of the CNT than in Working Example 4 and the resistivity was 6.4×10$^{-5}$ Ω·cm, which is worse than in Working Examples 3 and 4.

Thus, when the minimum distance between the innermost wall of the CNT and the dopant is not less than 2.0 Å and not more than 4.0 Å, then it is possible to achieve lower resistance and higher conductivity compared to conventional CNT composite materials.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A carbon nanotube aggregate, comprising:
a plurality of carbon nanotubes each having one or more walls,
wherein a ratio of a total number of carbon nanotubes that have two or three walls relative to a total number of said plurality of carbon nanotubes is 75% or greater, and
wherein, in a G band of a Raman spectrum in Raman spectroscopy of the plurality of carbon nanotubes, a G+/Gtotal ratio that is indicative of an amount of semiconductor carbon nanotubes relative to metallic carbon nanotubes is 0.70 or greater, and a G/D ratio that is defined as a ratio in the Raman spectrum of the G band and a D band due to a crystallinity is 45 or greater.

2. The carbon nanotube aggregate according to claim 1, wherein at least some of the plurality of carbon nanotubes are doped with one or more of nitric acid, sulfuric acid, iodine, bromine, potassium, sodium, boron, and nitrogen.

3. The carbon nanotube aggregate according to claim 1, wherein at least some of the plurality of carbon nanotubes are doped with one of lithium, rubidium, cesium, calcium, strontium, barium, fluorine, chlorine, bromine, and iodine.

4. The carbon nanotube aggregate according to claim 1, wherein an outer diameter of an outermost wall of the carbon nanotubes is 5.0 nm or less.

5. A carbon nanotube wire comprising a bundle of the plurality of carbon nanotubes as set forth in claim 1.

6. A carbon nanotube composite material, comprising:
a plurality of carbon nanotubes each having one or more walls; and
a doping element that is different from carbon and included inside each of the plurality of the carbon nanotubes,
wherein in each of the plurality of carbon nanotubes, a minimum distance between carbon atoms forming an innermost wall of the carbon nanotube and an atom of the doping element, as measured by a Transmission Electrons Microscope (TEM) images of the carbon nanotube composite material, taking an average of 200 samples, is less than a distance between said carbon atoms forming the innermost wall of the carbon nanotube and a center of the carbon nanotube, and
wherein in a Raman spectrum in Raman spectroscopy of the plurality of carbon nanotubes, a G/D ratio that is defined as a ratio in the Raman spectrum of a G band and a D band due to a crystallinity is 45 or greater.

7. The carbon nanotube composite material according to claim 6, wherein the minimum distance is not less than 2.0 angstroms and not more than 4.0 angstroms.

8. The carbon nanotube composite material according to claim 6, wherein the doping element is one of lithium, sodium, potassium, rubidium, cesium, calcium, strontium, barium, fluorine, chlorine, bromine, and iodine.

9. The carbon nanotube composite material according to claim 6, wherein each of the plurality of carbon nanotubes has two or three walls.

10. The carbon nanotube composite material according to claim 8, wherein in each of the plurality of carbon nanotubes, a charge transfer amount between the carbon atoms forming the innermost wall of the carbon nanotube and the atom of the doping element positioned at the minimum distance is 0.5 or greater per said doping element.

11. The carbon nanotube composite material according to claim 9, wherein in each of the plurality of carbon nanotubes, a charge transfer amount between the carbon atoms forming the innermost wall of the carbon nanotube and the atom of the doping element positioned at the minimum distance is 0.5 or greater per said doping element.

12. The carbon nanotube composite material according to claim 8, wherein in each of the plurality of carbon nanotubes, a ratio of a mass of the carbon nanotube with the doping element to a mass of the carbon nanotube without the doping element is 1.005 to 1.25.

13. The carbon nanotube composite material according to claim 9, wherein in each of the plurality of carbon nanotubes, a ratio of a mass of the carbon nanotube with the doping element to a mass of the carbon nanotube without the doping element is 1.005 to 1.25.

14. The carbon nanotube composite material according to claim 10, wherein in each of the plurality of carbon nanotubes, a ratio of a mass of the carbon nanotube with the doping element to a mass of the carbon nanotube without the doping element is 1.005 to 1.25.

15. The carbon nanotube composite material according to claim 11, wherein in each of the plurality of carbon nanotubes, a ratio of a mass of the carbon nanotube with the doping element to a mass of the carbon nanotube without the doping element is 1.005 to 1.25.

16. A carbon nanotube wire, comprising a bundle of the carbon nanotube composite material as set forth in claim 6.

17. A carbon nanotube aggregate, comprising:
a plurality of carbon nanotubes having one or more walls; and
a doping element included inside at least some of the plurality of the carbon nanotubes,
wherein a ratio of a total number of carbon nanotubes that have two or three walls relative to a total number of said plurality of carbon nanotubes is 75% or greater,
wherein, in a G band of a Raman spectrum in Raman spectroscopy of the plurality of carbon nanotubes, a G+/Gtotal ratio that is indicative of an amount of semiconductor carbon nanotubes relative to metallic carbon nanotubes is 0.70 or greater, and a G/D ratio that is defined as a ratio in the Raman spectrum of the G band and a D band due to a crystallinity is 45 or greater, and
wherein in said at least some of the plurality of the carbon nanotubes having the doping element included therein, a minimum distance between carbon atoms forming an innermost wall of the carbon nanotube and an atom of the doping element, as measured by a Transmission Electrons Microscope (TEM) images of the carbon nanotube composite material, taking an average of 200 samples, is less than a distance between said carbon atoms forming the innermost wall of the carbon nanotube and a center of the carbon nanotube.

18. A carbon nanotube wire, comprising a bundle of the carbon nanotube aggregate as set forth in claim 17.

* * * * *